United States Patent
Ferguson et al.

(10) Patent No.: US 10,852,366 B2
(45) Date of Patent: Dec. 1, 2020

(54) MAGNETIC FLUX SOURCE SYSTEM

(71) Applicants: David George Ferguson, Takoma Park, MD (US); Sergey S. Novikov, Baltimore, MD (US); Anthony Joseph Przybysz, Linthicum, MD (US); Robert T. Hinkey, Baltimore, MD (US); Aaron A. Pesetski, Gambrills, MD (US); Kenneth M. Zick, Baltimore, MD (US)

(72) Inventors: David George Ferguson, Takoma Park, MD (US); Sergey S. Novikov, Baltimore, MD (US); Anthony Joseph Przybysz, Linthicum, MD (US); Robert T. Hinkey, Baltimore, MD (US); Aaron A. Pesetski, Gambrills, MD (US); Kenneth M. Zick, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 285 days.

(21) Appl. No.: 16/019,210

(22) Filed: Jun. 26, 2018

(65) Prior Publication Data
US 2019/0391214 A1 Dec. 26, 2019

(51) Int. Cl.
*G01R 33/035* (2006.01)
*G06N 10/00* (2019.01)
*H01L 39/22* (2006.01)

(52) U.S. Cl.
CPC ......... *G01R 33/0358* (2013.01); *G06N 10/00* (2019.01); *H01L 39/223* (2013.01)

(58) Field of Classification Search
CPC .............. G01R 33/0206; G01R 33/028; G01R 33/038; G01R 33/1215
See application file for complete search history.

(56) References Cited

U.S. PATENT DOCUMENTS

| 4,800,345 A | 1/1989 | Podell et al. |
| 5,036,279 A * | 7/1991 | Jonsen ............... G01R 33/0356 324/248 |

(Continued)

FOREIGN PATENT DOCUMENTS

| EP | 2730029 A2 | 5/2014 |
| JP | 2013-058705 A | 3/2013 |

(Continued)

OTHER PUBLICATIONS

Fabio Chiarello, et al: Superconducting tunable flux qubit with direct readout scheme: Superconducting tunable flux qubit with direct readout scheme:, Superconductor Science and Technology, IOP Publishing,K Techno House, Bristol, GB, vol. 18, No. 10, Oct. 1, 2005, pp. 1370-1373, XP020087996, ISSN: 0953-2048, DOI: 10.1088/0953-2048/18/10/021 Sections 1-3; figures 1, 2.

(Continued)

*Primary Examiner* — Tung X Nguyen
(74) *Attorney, Agent, or Firm* — Tarolli, Sundheim, Covell & Tummino LLP

(57) ABSTRACT

One example includes a magnetic flux source system that includes a tunable current element. The tunable current element includes a SQUID inductively coupled to a first control line that conducts a first control current that induces a bias flux in the SQUID to decrease relative energy barriers between discrete energy states of the tunable current element. The system also includes an inductor in a series loop with the SQUID and inductively coupled to a second control line that conducts a second control current that induces a control flux in the series loop to change a potential energy of the discrete energy states of the tunable current element to set an energy state of the tunable current element to one of the discrete energy states to generate a current that (Continued)

provides a magnetic flux at an amplitude corresponding to the energy state of the at least one tunable current element.

20 Claims, 8 Drawing Sheets

(56) References Cited

U.S. PATENT DOCUMENTS

| | | | |
|---|---|---|---|
| 5,053,706 A * | 10/1991 | Ohkawa | G01R 33/0358 324/248 |
| 5,552,735 A | 9/1996 | Kang et al. | |
| 5,818,308 A | 10/1998 | Tanaka et al. | |
| 6,346,863 B2 | 2/2002 | Sasaki et al. | |
| 6,407,647 B1 | 6/2002 | Apel et al. | |
| 6,636,126 B1 | 10/2003 | Pozdeev | |
| 6,747,525 B2 | 6/2004 | Iida et al. | |
| 6,765,455 B1 | 7/2004 | De Lillo | |
| 6,806,558 B2 | 10/2004 | Apel | |
| 7,969,178 B2 | 6/2011 | Przybysz et al. | |
| 9,257,736 B1 | 2/2016 | Josypenko | |
| 9,647,662 B1 | 5/2017 | Abutaleb et al. | |
| 9,710,758 B2 | 7/2017 | Bunyk et al. | |
| 9,722,589 B1 | 8/2017 | Talanov et al. | |
| 9,768,771 B2 | 9/2017 | Naaman | |
| 9,928,948 B2 | 3/2018 | Naaman et al. | |
| 10,042,805 B2 | 8/2018 | Naaman et al. | |
| 10,133,299 B1 | 11/2018 | Strong et al. | |
| 2003/0218516 A1 | 11/2003 | Gilbert et al. | |
| 2004/0189388 A1 | 9/2004 | Nguyen et al. | |
| 2006/0147154 A1 | 7/2006 | Thom et al. | |
| 2006/0220737 A1 | 10/2006 | Sanderson | |
| 2009/0078931 A1 | 3/2009 | Berkley | |
| 2009/0189712 A1 | 7/2009 | Jiang | |
| 2010/0148853 A1 | 6/2010 | Harris et al. | |
| 2011/0054876 A1 | 3/2011 | Biamonte et al. | |
| 2016/0335558 A1 | 11/2016 | Bunyk et al. | |
| 2016/0335560 A1 | 11/2016 | Mohseni et al. | |
| 2017/0127205 A1 | 5/2017 | Lin | |
| 2017/0201224 A1 | 7/2017 | Strong et al. | |
| 2017/0286859 A1 | 10/2017 | Harris et al. | |
| 2018/0091115 A1 | 3/2018 | Abdo | |
| 2019/0007051 A1 | 1/2019 | Sete et al. | |
| 2019/0385088 A1 * | 12/2019 | Naaman | G01R 33/0358 |

FOREIGN PATENT DOCUMENTS

| | | |
|---|---|---|
| JP | 5363993 B2 | 12/2013 |
| WO | 98/36467 | 8/1998 |
| WO | 20100028183 A1 | 3/2010 |
| WO | 20140285302 A2 | 2/2014 |
| WO | 20170058194 A1 | 4/2017 |
| WO | 2017/111949 | 6/2017 |
| WO | 2017022806 A1 | 11/2017 |
| WO | 2017/222806 | 12/2017 |

OTHER PUBLICATIONS

International Search Report for International Application No. PCT/US2019/036576 dated Oct. 24, 2019.
International Search Report for International Application No. PCT/US2019/035607 dated Oct. 1, 2019.
G. Samach, et al.: "Coupled qubits for next generation quantum annealing: novel interactions", Abstract submitted to the APS March Meeting 2017, Jan. 4, 2017, XP055469301, Retrieved from the Internet: URL: http://absimage.aps.org/image/MAR17-2016-003302. pdf, abstract.
Ferguson et al: "Non-stoquastic XX couplers for superconducting flux qubits", Abstract submitted to the APS March Meeting 2017, Jan. 4, 2017, XP055469302, Retrieved from the Internet: URL: http://absimage.aps.org/image/Mar17/MWS_Mar17-2016-008291. pdf, abstract.
International Search Report for International Application No. PCT/US2018/015729 dated May 2, 2018.
Lanting et al: "Cotunneling in pairs of coupled flux qubits", Physical Review B, vol. 82, 060512R, Aug. 23, 2010, XP055469296, figures 1(a) & (b).
Chen et al.: "Qubit Architecture with High Coherence and Fast Tunable Coupling", Physical Review Letters, US, (Nov. 26, 2014), vol. 113, No. 22, doi:10.1103/PhysRevLett.113.220502, ISSN 0031-9007.
Ehara, et al.: "Development of Pulse Transfer Circuits for Serially Biased SFQ Circuits Using the Nb 9-Layer 1um Process", IEEE Transactions on Applied Superconductivity, IEEE Service Center (Jun. 1, 2013), vol. 23, No. 3, p. 1300504.
International Search Report from corresponding PCT/US2019/012065, dated May 17, 2019.
International Search Report from corresponding PCT/US2019/018497; dated May 15, 2019.
Lu: "Master Thesis Towards Tunable Coupling Between Two Superconducting Transmission Line Resonators"; Aug. 24, 2012 (Aug. 24, 2012), XP055585125, Retrieved from the Internet:URL:https://www.wmi.badw.de/publications/theses/Xiaoling, Lu Master Thesis 2012.pdf [retrieved on May 2, 2019]; abstract, section 1, section 2, section 3, section 4.
Rafique et al.: Tunable filter based on DC-SQUID chain 1; May 1, 2007 (May 1, 2007), pp. 1-2, XP055585121, DOI: 10.13140/RG.2.1.1612.5688, Retrieved from the Internet: URL:https://www.researchgate.net/profile/RaihanRafique2/publication/305769905 Tunable filter based on DC SQUID chain/links/57a07d4408ae94f454eb0968/Tunable-filter-based-on-DC-SQUID-chain.pdf. [retrieved on May 2, 2019].
Tuorila et al: "Efficient protocol for qubit initialization with a tunable environment", Arxiv.org, Cornell University Library, 201, Olin Library Cornell University Ithaca, NY 14853, Dec. 13, 2016 (Dec. 13, 2016), XP080743892, DOI: 10.1038/S41534-017-0027-1; abstract, figures 1-3, p. 1, line 1-p. 7, last line.
Final Office Action for U.S. Appl. No. 15/868,557 dated Jul. 25, 2019.
Japanese Office Action for Application No. 2018-533894 dated Aug. 20, 2019.
Non Final Office Action for U.S. Appl. No. 15/866,602 dated Aug. 21, 2019.
Non Final Office Action for U.S. Appl. No. 16/255,588 dated Sep. 5, 2019.
Harris R et al: "Sign- and magnitude-tunable coupler for superconducting flux qubits", ARXIV.org, Cornell University Library, 201 OLIN Library Cornell University Ithaca, NY 14853, Aug. 11, 2006 (Aug. 11, 2006), XP080248067; DOI: 10.1103/PHYSREVLETT.98. 177001 figure 1.
Kang H et al: "Current recycling and SEQ signal transfer in large scale RSFQ circuits", IEEE Transactions on Applied Superconductivity, IEEE Service Enter, Los Alamitos, CA, US; vol. 13, No. 2, Jun. 1, 2003 (Jun. 1, 2003), pp. 547-550, XP011097824, ISSN: 1051-8223, DOI: 10. 1109/TASC.2003.813932 figure 2.
Ehara K et al: "Development of Pulse Transfer Circuits for Serially Biased Sfq Circuits Using the Nb 9-Layer 1—$\mu\hbox{m}$ Process", IEEE Transactions on Applied Superconductivity, IEEE Service Center, Los Alamitos, CA, US, vol. 23, No. 3, Jun. 1, 2013 (Jun. 1, 2013), p. 1300504, XP011513813, ISSN: 1051-8223, DOI: 10. 1109/TASC.2012.2233535 figure 1.
Yu Chen et al: "Qubit Architecture with High Coherence and Fast Tunable Coupling", Physical Review Letters, vol. 113, No. 22, Nov. 26, 2014 (Nov. 26, 2014), XP055403674; US ISSN: 0031-9007, DOI: 10.1103/PhysRevLett.113.220502 figure 1.
International Search Report for International Application No. PCT/US2017/036169 dated Sep. 25, 2017.
International Search Report for International Application No. PCT/US2019/012049 dated Dec. 4, 2019.
Worsham A H et al: "A Single Flux Quantum cross-bar switch and demultiplexer" IEEE Transactions on Applied Superconductivity; IEEE Service Center, Los Alamitos, CA, US, vol. 5, No. 2, Jun. 1, 1995 (Jun. 1, 1995), pp. 2996-2999, XP011504599; ISSN: 1051-8223, DOI: 10.1109/77.403222 Section II.; figure 1.
Written Opinion and Search Report corresponding to International Application No. PCT/US2019/014796 dated Apr. 26, 2019.

(56) References Cited

OTHER PUBLICATIONS

Anonymous: What is the self-resonant frequency of a capacitor?, May 22, 2017, XP055582197,Retrieved from the Internet:URL:https://www.quora.com What-is-the-self-resonant-frequency-of-a-capacitor[retrieved on Apr. 17, 2019] the whole document.

Tuori et al: 11 Efficient protocol 1-20 for qubit initialization with a tunable environment, Arxiv.org, Cornell University Li Bra Ry, 201 OLIN Library Cornell University Ithaca, NY 14853, Dec. 13, 2016 (Dec. 13, 2016)'XP080743892,DOI: 10.1038/S41534-017-0027-1 abstract; figures 1-6 p. 1, line 1-p. 6, last line p. 8, line 1-p. 11, last line p. 13, 1ine 10-p. 16, last line.

Robertson et al: "Superconducting device to isolate,entangle, and read out quantum flux states", Mar. 21, 2016, pp. 1-4,ResearchGate Retrieved from the Internet: IRL:https://www.researchgate.net/publication/255276503, Superconducting device to isolate entangle and read out quantum flux states[retrieved on Sep. 27, 2018]abstract; figures 1-4 p. 1, left-hand column, line 1-p. 4,right-hand column, last line.

Kafri:"Tunable inductive coupling of superconducting qubits in the Srongly nonlinear regime",arXiv:1606.08382v2,Jan. 23, 2017 (Jan. 23, 2017), xP055469297,Retrieved from the internet:URL:https://arxiv.orgabs1606.08382v2[retrieved on Apr. 20, 2018]abstract; figures 1-3 p. 1, line 1-p. 22, last line.

Schmitt et al: "Multiplexed readout of transmon qubits with Josephson Bifurcation amplifiers",Physical Review A (Atomic, Molecular, and Optical Physics),vol. 90, No. 6, Dec. 1, 2014 (Dec. 1, 2014), XP055511194, USA ISSN: 1050-2947, DOI: 10.1103/PhysRevA.90.062333 abstract; figures 1-4 p. 1, Left-hand column, line 1-p. 4,right-hand column, line 25.

Jeffrey Scott Birenbaum, "The C-shunt Flux Qubit: A New Generation of Superconducting Flux Qubit", eScholarship, (Jan. 1, 2014), URL:https://escholarship.org/uc/item/3gg7j6rh, (Sep. 27, 2018).

Australian Examination Report for Application No. 2018299815 dated Aug. 6, 2020.

International Search Report for Application No. PCT/US2019/058793 dated Aug. 4, 2020.

\* cited by examiner

MAGNETIC FLUX SOURCE SYSTEM

GOVERNMENT INTEREST

The invention was made under Government Contract Number W911NF-17-C-0050. Therefore, the US Government has rights to the invention as specified in that contract.

TECHNICAL FIELD

The present disclosure relates generally to superconducting circuit systems, and specifically to a magnetic flux source system.

BACKGROUND

Superconducting digital technology has provided computing and/or communications resources that benefit from unprecedented high speed, low power dissipation, and low operating temperature. Superconducting technology also provides potential technological capabilities for both digital quantum computing where the fundamental information unit is the quantum bit and computation proceeds by digital gate operations, as well as for analog quantum computing technologies such as quantum annealing. For quantum technologies, the bit information can exist in quantum superposition, a uniquely quantum property which may enable dramatic enhancement in time to solution for specific applications. In addition to computing applications, superconducting technologies also shows promise as ultra-sensitive detectors. For both classical and quantum cryogenic computing and sensing circuits, including superconducting computing circuits, the operating point of numerous components can be set via a magnetic flux source. Examples include setting the coupling strength of tunable couplers for quantum annealers, the operating frequency of a qubit, or as memory, e.g., for the instruction memory of a superconducting digital processor.

SUMMARY

One example includes a magnetic flux source system that includes a tunable current element. The tunable current element includes a SQUID inductively coupled to a first control line that conducts a first control current that induces a bias flux in the SQUID to decrease relative energy barriers between discrete energy states of the tunable current element. The system also includes an inductor in a series loop with the SQUID and inductively coupled to a second control line that conducts a second control current that induces a control flux in the series loop to change a potential energy of the discrete energy states of the tunable current element to set an energy state of the tunable current element to one of the discrete energy states to generate a current that provides a magnetic flux at an amplitude corresponding to the energy state of the at least one tunable current element.

Another example includes a method for generating a flux bias via a tunable current element. The method includes activating a first control current that is provided on a first control line, the first control line being inductively coupled to a SQUID associated with the tunable current element, such that the first control current induces a bias flux in the SQUID to decrease relative energy barriers between discrete energy states of the tunable current element. The method also includes activating a second control current that is provided on a second control line, the second control line being inductively coupled to an inductor provided in a series loop with the SQUID associated with the tunable current element. The second control current induces a control flux in the series loop to change a potential energy of the discrete energy states from a default potential energy condition of the discrete energy states of the tunable current element to set an energy state of the tunable current element to a respective one of the discrete energy states. The method also includes deactivating the first control current to increase the relative energy barriers between the discrete energy states of the tunable current element. The method further includes deactivating the second control current to return the tunable current element to the default potential energy condition, such that the energy state of the tunable current element is maintained at the respective one of the discrete energy states based on the relative energy barriers between the discrete energy states.

Another example includes a magnetic flux source system comprising a plurality of tunable current elements arranged in an array comprising at least one row and at least one column. Each of the plurality of tunable current elements includes a SQUID that is inductively coupled to a respective one of at least one first control line associated with the respective at least one column and configured to conduct a first control current, such that the respective one of the at least one first control current induces a bias flux in the SQUID to decrease relative energy barriers between discrete energy states of the respective at least one tunable current element. Each of the tunable current elements also includes an inductor arranged in a series loop with the SQUID and being inductively coupled to one of at least one second control line configured to conduct a respective one of at least one second control current associated with the respective at least one row. The respective one of the at least one second control current induces a control flux in the series loop to change a potential energy of the discrete energy states of the respective at least one tunable current element to set an energy state of the at least one tunable current element to one of the discrete energy states. The SQUID is configured to generate a current to provide a magnetic flux at an amplitude corresponding to the energy state of the at least one tunable current element.

DETAILED DESCRIPTION

Figure 1:
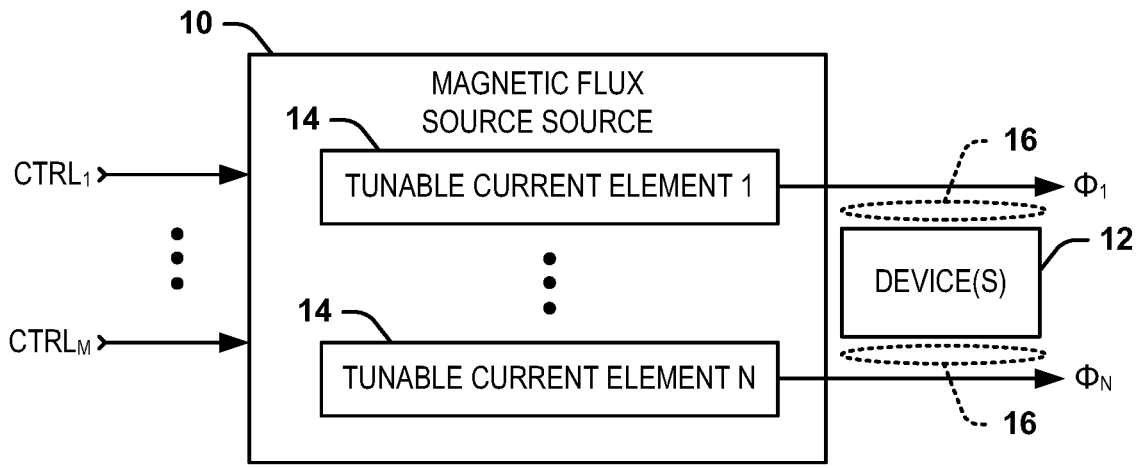
FIG. 1 illustrates an example of a magnetic flux bias source system.

The present disclosure relates generally to superconducting circuit systems, and specifically to a magnetic flux source system. The magnetic flux source system includes at least one tunable current element that can provide a magnetic flux bias. As described herein, the term "magnetic flux" or "flux bias" refers to a magnetic flux generated by the tunable current element, which can be inductively provided to a target circuit device. Each of the tunable current elements includes a superconducting quantum interference device (SQUID) that includes at least two Josephson junctions, and further includes an inductor that is arranged in a series loop with the SQUID. A first control line is inductively coupled to the SQUID (e.g., to one of the Josephson junctions of the SQUID), such that a first control current can induce a bias flux in the SQUID. Similarly, a second control line is inductively coupled to the inductor, such that a second control current can induce a control flux in the series loop.

The SQUID can be arranged to have a plurality of discrete energy states, with each of the discrete energy states being separated by an energy barrier at the default potential energy condition. Thus, the energy barriers maintain stability of the discrete energy states at the default potential energy condition. Therefore, the tunable current element (e.g., the SQUID of the tunable current element) can be set to one of the non-zero discrete energy states, which can be maintained at the default potential energy condition based on the energy barriers. In response to the bias flux induced in the SQUID, the energy barriers can be decreased to provide some instability of the discrete energy states. In response, the energy state of the tunable current element can decrease to a zero energy state at the default potential energy condition based on the decrease of the energy barriers in response to the bias flux. In response to the control flux induced by the second control current, the potential energy of the tunable energy element can be changed, such that the relative energy of the discrete energy states can be changed. Therefore, the energy state of the tunable current element can be changed in response to the control flux and based on the induced bias flux. Upon setting the energy state of the tunable current element to a given one of the discrete energy states, the bias flux can be deactivated to return the energy barriers. As a result, the respective one of the discrete energy states that is at a minimum relative to the other discrete energy states can be set as the energy state of the tunable current element.

As an example, the magnetic flux source system can include a plurality of tunable current elements that are arranged in an array of rows and columns. For example, the first and second control lines can be associated with respective rows and columns. As described herein, the rows and columns of an array are to be considered non-specific with respect to the first and second control lines for purposes of accessing a given one of the tunable current elements, such that the first control lines that provide the first control currents to induce bias fluxes in the SQUIDs can be associated with rows or columns of the array, and the second control lines that provide the second control currents to induce control fluxes in the series loops can be associated with the other of the rows or columns of the array. Therefore, the control lines are not limited to specific implementation in the rows and columns, as described herein. Additionally, the SQUIDs can include more than two Josephson junctions to mitigate problems with Josephson junction asymmetry and/or to provide a manner for addressing specific individual tunable current elements, as opposed to setting energy states on each tunable current element of a given row or column, as described in greater detail herein.

FIG. 1 illustrates an example of a magnetic flux source system 10. The magnetic flux source system 10 can be implemented in any of a variety of quantum or classical/quantum computer systems to provide a flux bias to one or more targets 12, such as in a quantum computing environment. For example, the magnetic flux source system 10 can be implemented in an annealing application for providing a flux bias to a variety of circuit components.

In the example of FIG. 1, the magnetic flux source system 10 includes a plurality N of tunable current elements 14, where N is a positive integer (e.g., which could equal one). The tunable current elements 14 are each configured to generate a respective one of a plurality of currents that can provide flux biases $\Phi_1$ through $\Phi_N$, respectively, to the targets(s) 12, demonstrated generally at 16. The tunable current elements 14 can each be controlled via a plurality of control currents $CTRL_1$ through $CTRL_M$ that are provided on separate respective control lines. As an example, the control currents CTRL can correspond to respective groups of control currents that each has a separate respective function with respect to the tunable current elements 14, as described in greater detail herein. The control currents CTRL can induce a bias flux and a control flux in the respective tunable current elements 14 to set each of the tunable current elements 14 to a respective energy state. As described herein, the term "energy state" refers to a quantized amplitude of current $I_{FLUX}$ that is provided through a respective tunable current element 14, with the amplitude of the magnetic flux bias $\Phi$ corresponding to the amplitude of the corresponding current $I_{FLUX}$.

Figure 2:
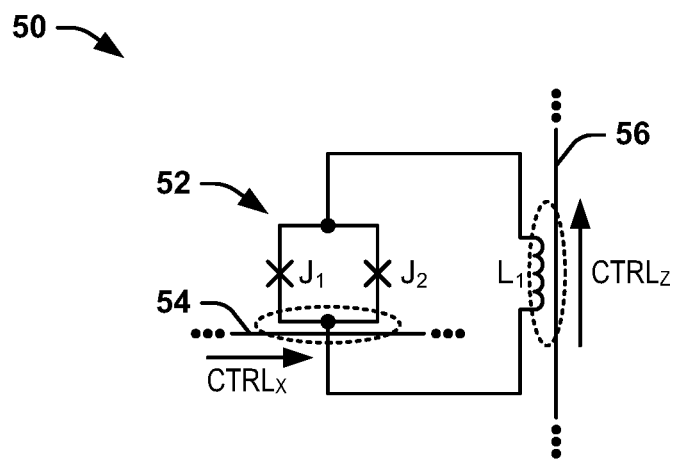
FIG. 2 illustrates an example of a tunable current element.

FIG. 2 illustrates an example of a tunable current element 50. The tunable current element 50 can correspond to one of the tunable current elements 14 in the example of FIG. 1. Therefore, reference is to be made to the example of FIG. 1 in the following description of the example of FIG. 2.

The tunable current element 50 includes a first Josephson junction $J_1$ and a second Josephson junction $J_2$ that are arranged in parallel, and thus correspond to a superconducting quantum interference device (SQUID) 52. The SQUID 52 is demonstrated as being arranged in a series loop with an inductor $L_1$. In the example of FIG. 2, a first control line 54 is demonstrated as being inductively coupled to the SQUID 52. While the example of FIG. 2 demonstrates that the first control line 54 is inductively coupled to the SQUID 52 as a whole, it is to be understood that the first control line 54 can be inductively coupled to a single one or both of the Josephson junctions $J_1$ and $J_2$. The first control line 54 is demonstrated as conducting a first control current $CTRL_X$. As an example, X can correspond to a given one of a plurality of columns (or rows) associated with an array of tunable current elements 50. Similarly, a second control line 56 is demonstrated as being inductively coupled to the inductor $L_1$. The second control line 56 is demonstrated as conducting a second control current $CTRL_Z$. As an example, Y can correspond to a given one of a plurality of rows (or columns) associated with the array of tunable current elements 50. Therefore, as described in greater detail herein, the first and second control currents $CTRL_X$ and $CTRL_Z$ can set an energy state of the tunable current element 50, such as in an addressable manner similar to a memory array.

As an example, the SQUID 52 can be arranged to have a plurality of discrete energy states, with each of the discrete energy states being separated by an energy barrier at a default potential energy condition. Thus, the energy barriers maintain stability of the discrete energy states at the default potential energy condition. Therefore, the tunable current element 50 (e.g., the SQUID 52 of the tunable current element 50) can be set to one of the non-zero discrete energy states, which can be maintained at the default potential energy condition based on the energy barriers. In other words, once the energy state is set and the energy barriers between the discrete energy states are established (e.g., via a zero bias flux), the SQUID 52 can provide a hysteretic flux Φ, even when the potential energy of the SQUID 52 is changed, such as when the potential energy of an entire row or column of tunable current elements 50 is changed in response to addressing a single tunable current element 50, as described in greater detail herein.

For example, the first control current $CTRL_X$ can induce a bias flux in the SQUID 52 to reduce the energy barriers between the discrete energy states of the tunable current element 50. As another example, the second control current $CTRL_Z$ can induce a control flux in the series loop of the tunable current element 50 to change the potential energy of the tunable current element 50. Therefore, by manipulating the potential energy of tunable current element 50, such as while the bias flux reduces the energy barriers between the discrete energy states of the tunable current element 50, the energy state of the tunable current element 50 can be set to one of the non-zero energy states of the SQUID 52. As described herein, each of the terms "energy state" and "potential energy", as applied to the SQUID 52 and to the tunable current element 50 as a whole, are used interchangeably herein. In other words, the term "energy state" can refer to the energy state of the SQUID 52 or the tunable current element 50 as a whole, and the term "potential energy" can refer to the potential energy of the SQUID 52 or of the tunable current element 50 as a whole.

As an example, in response to the bias flux induced in the SQUID 52 via the first control current $CTRL_X$, the energy barriers can be decreased to provide instability of the discrete energy states. In response, the energy state of the tunable current element 50 can decrease to a zero energy state at the default potential energy condition based on the decrease of the energy barriers via the induced bias flux. In response to the control flux induced by the second control current $CTRL_Z$, the potential energy of the tunable energy element 50 can be changed, such that the relative energy of the discrete energy states can be changed. Therefore, the energy state of the tunable current element 50 can be changed in response to the control flux and based on the induced bias flux. Upon setting the energy state of the tunable current element 50 to a given one of the discrete energy states, the bias flux can be deactivated to return the energy barriers. As a result, the respective one of the discrete energy states that is at a minimum relative to the other discrete energy states can be set as the energy state of the tunable current element. The control flux can then be deactivated to return the tunable current element 50 to the default potential energy condition.

Figure 3:
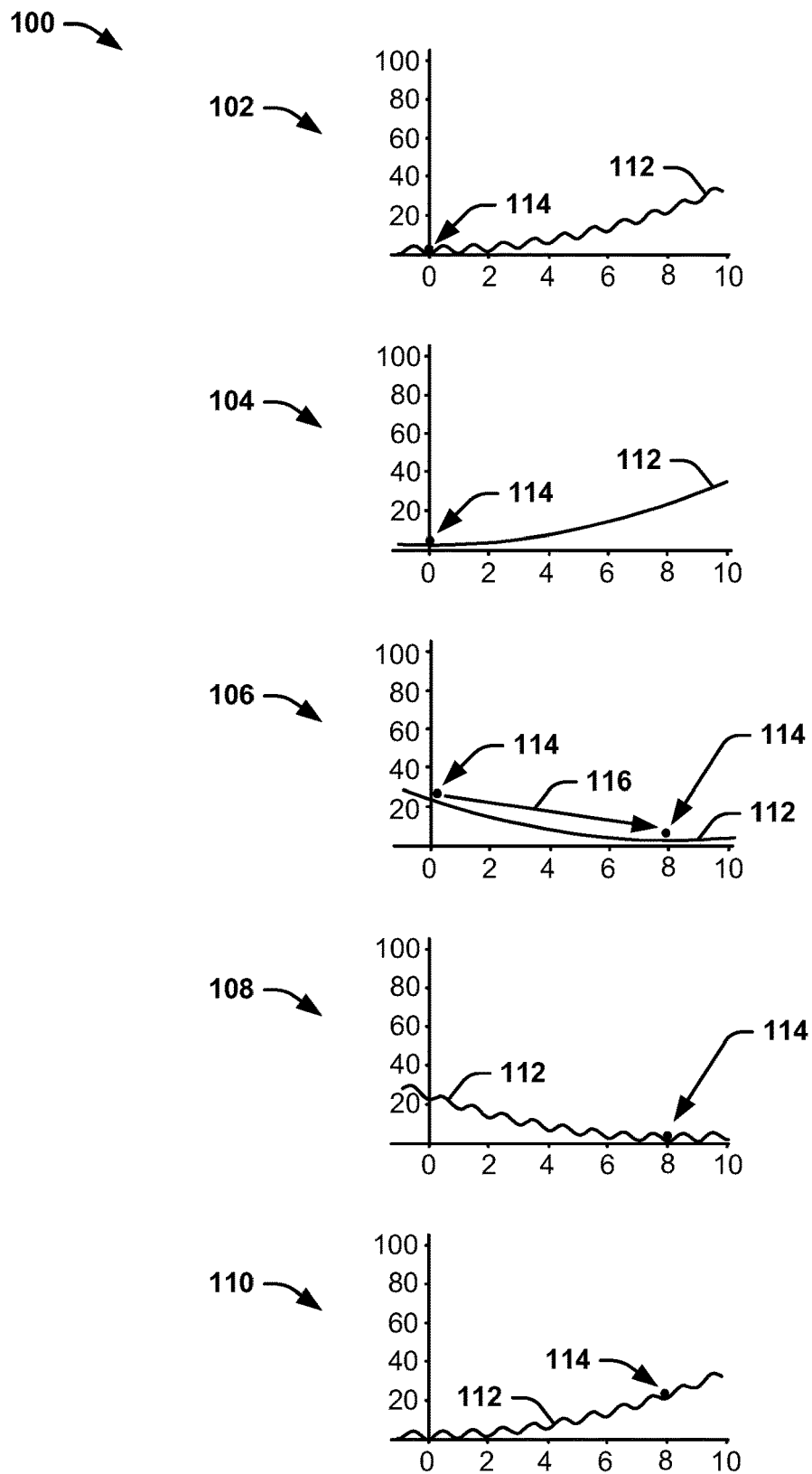
FIG. 3 illustrates an example diagram of setting an energy state.

FIG. 3 illustrates an example diagram 100 of setting an energy state. The diagram 100 includes a set of five graphs, demonstrated as 102, 104, 106, 108, and 110, that can correspond to the sequence of changes of the potential energy and the energy barriers of a given tunable current element, such as the tunable current elements 14 and 50 in the respective examples of FIGS. 1 and 2. Therefore, reference is to be made to the examples of FIGS. 1 and 2 in the following description of the examples of FIG. 3.

Each of the graphs of the diagram 100 demonstrates an energy amplitude on a Y-axis and an energy state quantization number on the X-axis. Setting the energy state of the tunable current element 50 can be described by how the magnetic fluxes (e.g., the bias flux and the control flux) affect the inductive potential energy of the SQUID 52. The potential energy of the SQUID 52 can be defined as follows:

$$\beta e^{-i\gamma} = \left(\frac{2\pi}{\Phi_0}\right) L (Ic_1 e^{-i\pi \Phi_X/\Phi_0} + Ic_2 e^{i\pi \Phi_X/\Phi_0}) \qquad \text{Equation 1}$$

$$\beta_0 = \beta(\Phi_X = 0) \qquad \text{Equation 2}$$

$$U_L = \frac{1}{L}\left(\frac{\Phi_0}{2\pi}\right)^2 \qquad \text{Equation 3}$$

Where: $\Phi_X$ is the bias flux based on the first control current $CTRL_X$;
 $\Phi_Z$ is the bias flux based on the first control current $CTRL_Z$;
 γ is a term that describes non-linear crosstalk phase;
 $\Phi_0$ is a term that describes the superconducting flux quantum;
  Where: $\Phi_0$=h/2e;
   Where: h is Planck's constant; and
    e is the electron charge;
 L is the loop inductance;
 $U_L$ is the potential energy scale factor;
 k is the critical current of the respective Josephson junction;
  And: $I_{FLUX} \approx 2\pi$ NJ Ic n/$\beta_0 \approx n\Phi_0/L$;
   Where: n is the energy state of the SQUID 52;
    NJ=the number of Josephson junctions in the SQUID 52.

Based on the definitions set forth by Equations 1-3, the potential energy $U/U_L$ of the SQUID 52, as a function of the superconducting phase θ, can be defined as follows:

$$\frac{U(\theta, \Phi_X, \Phi_Z)}{U_L} = -\beta(\Phi_X)\cos(\theta - \gamma(\Phi_X)) + \frac{1}{2}\left(\theta - \frac{2\pi\Phi_Z}{\Phi_0}\right)^2 \qquad \text{Equation 4}$$

Thus, each of the graphs of the diagram 100 includes the potential energy demonstrated at 112 (in units of energy $U/U_L$ on the Y-axis) of the tunable current element 50.

The first graph 102 demonstrates a default condition of the potential energy 112, and thus the default potential energy condition. As described herein, the terms "default condition" of the potential energy 112, or just "default potential energy condition", describe a condition in which there is no applied bias flux $\Phi_X$ and no applied control flux $\Phi_Z$, and thus no application of the first and second control currents $CTRL_X$ and $CTRL_Z$, respectively. The first graph 102 thus demonstrates that the discrete energy states, demonstrated as discrete energy state indices numbering from "0" through "10", have ascending energy amplitudes and are separated by the energy barriers to provide stability between each of the discrete energy states. In the first graph 102, the energy state of the tunable current element 50, demonstrated at 114, is demonstrated at "0" initially. However, is to be understood that the initial energy state 114 of the tunable current element 50 could be any of the discrete energy states at the default potential energy condition based on the energy barriers providing stability of the discrete energy states, and thus hysteresis of the energy state 114 of the tunable current element 50.

The second graph 104 demonstrates a reduction of the energy barriers in response to application of the bias flux $\Phi_X$. As described previously, the first control current $CTRL_X$ can induce the bias flux $\Phi_X$ in the SQUID 52, which can thus decrease the energy barriers between the discrete energy states of the SQUID 52. As a result, the energy state of the SQUID 52 can decrease from any of the non-zero energy states to the zero energy state based on the energy state instability resulting from the decrease in the energy barriers. As described in greater detail herein, the SQUID 52 can thus release energy based on the difference between the energy state index number (e.g., up to ten as demonstrated in the example of FIG. 3) and zero. As also described in greater detail herein, the SQUID 52 can instead release energy based on a difference between a first state and a second state to which the tunable current element 50 is set to mitigate the amplitude of the released energy.

The third graph 106 demonstrates a change in the potential energy 112 of the tunable current element 50 in response to application of the control flux $\Phi_Z$. As an example, the second control current $CTRL_Z$ can induce the control flux $\Phi_Z$ in the series loop via the inductor $L_1$, which can thus "tilt" the potential energy 112 to change the relative energy amplitudes of the discrete energy states. In the example of FIG. 3, the potential energy 112 of the tunable current element 50 is demonstrated as changing from the default potential energy condition to a different potential energy state in which a non-zero index of the discrete energy states is set to a minimum potential energy relative to the remaining discrete energy states based on the amplitude of the applied second control current $CTRL_Z$, and thus the control flux $\Phi_Z$. In the example of FIG. 3, the discrete energy state that is set to the minimum potential energy relative to the remaining discrete energy states is demonstrated as the index "8" discrete energy state. As a result, the energy state 114 of the tunable current element 50 is demonstrated as moving from the "0" index discrete energy state to approximately the index "8" discrete energy state, as demonstrated by the arrow 116.

The fourth graph 108 demonstrates an increase of the energy barriers between the discrete energy states in response to deactivation of the bias flux $\Phi_X$. As an example, while the control flux $\Phi_Z$ is maintained at the specific amplitude to maintain the index "8" energy state at the minimum relative potential energy, the first control current $CTRL_X$ can be deactivated (e.g., ceased to flow on the first control line 54), thus deactivating the bias flux $\Phi_X$ in the SQUID 52. As a result, the energy barriers return between the discrete energy states of the SQUID 52 to resume the stability between the discrete energy states.

The fifth graph 110 demonstrates another change in the potential energy 112 of the tunable current element 50 in response to deactivation of the control flux $\Phi_Z$. As an example, the second control current $CTRL_Z$ can be deactivated to deactivate the control flux $\Phi_Z$ in the series loop via the inductor $L_1$. As a result, the potential energy 112 returns to the default potential energy condition in which the indices of the discrete energy states increase in energy in ascending order. Because of the energy barriers between the discrete energy states, the energy state 114 of the tunable current element 50 can be maintained at the index "8" discrete energy state. Accordingly, the tunable current element 50 can hysteretically provide a current $\Phi_{FLUX}$ having an amplitude that corresponds to the index "8" discrete energy state. As a result, a target device 12 can be inductively coupled to the respective tunable current element 50 to receive a flux bias 1 having an amplitude corresponding to the amplitude of the current $\Phi_{FLUX}$, and thus the index "8" discrete energy state.

Figure 4:
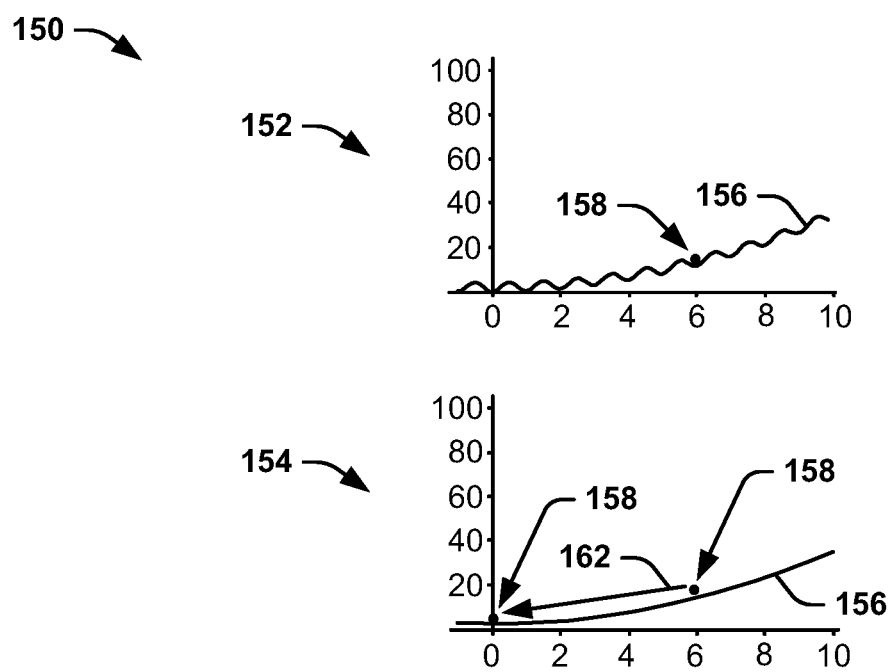
FIG. 4 illustrates another example diagram of setting an energy state.

FIG. 4 illustrates another example diagram 150 of setting an energy state. The diagram 150 includes a set of two graphs, demonstrated as 152 and 154, that can correspond to the sequence of change of the energy barriers of a given tunable current element, such as the tunable current elements 14 and 50 in the respective examples of FIGS. 1 and 2. The energy graphs are demonstrated as the same as the energy graphs in the example of FIG. 3. Therefore, reference is to be made to the examples of FIGS. 1-3 in the following description of the examples of FIG. 4.

As described previously, the SQUID 52 can release energy based on the difference between the energy state index number (e.g., up to ten as demonstrated in the example of FIG. 4) and zero. The first graph 152 demonstrates a default condition of a potential energy 156, and thus the default potential energy condition. The first graph 152 thus demonstrates that the discrete energy states, demonstrated as discrete energy state indices numbering from "0" through "10", have ascending energy amplitudes and are separated by the energy barriers to provide stability between each of the discrete energy states. In the first graph 152, the energy state of the tunable current element 50, demonstrated at 158, is demonstrated at index "6" initially.

The second graph 154 demonstrates a reduction of the energy barriers in response to application of the bias flux $\Phi_X$. As described previously, the first control current $CTRL_X$ can induce the bias flux $\Phi_X$ in the SQUID 52, which can thus decrease the energy barriers between the discrete energy states of the SQUID 52. As a result, the energy state 158 of the SQUID 52 is demonstrated as decreasing from the index "6" discrete energy state to the zero energy state (the index "0" discrete energy state), demonstrated by the arrow 162, based on the energy state instability resulting from the decrease in the energy barriers. As a result, the SQUID 52 releases a quantity of energy based on the difference between the index "6" energy state and the index "0" index number. In a superconducting environment, such a release in energy may be acceptable, or may be unacceptable given the conversion of the energy to heat in a cold-space superconducting environment (e.g., that the temperature remain less than 1 Kelvin). Therefore, instead of setting the energy state of the tunable current element 50 to a given state by "resetting" the energy state of the tunable current element 50 to the zero energy state, the tunable current element 50 can have an energy state that is set adiabatically, as described in greater detail herein.

Figure 5:
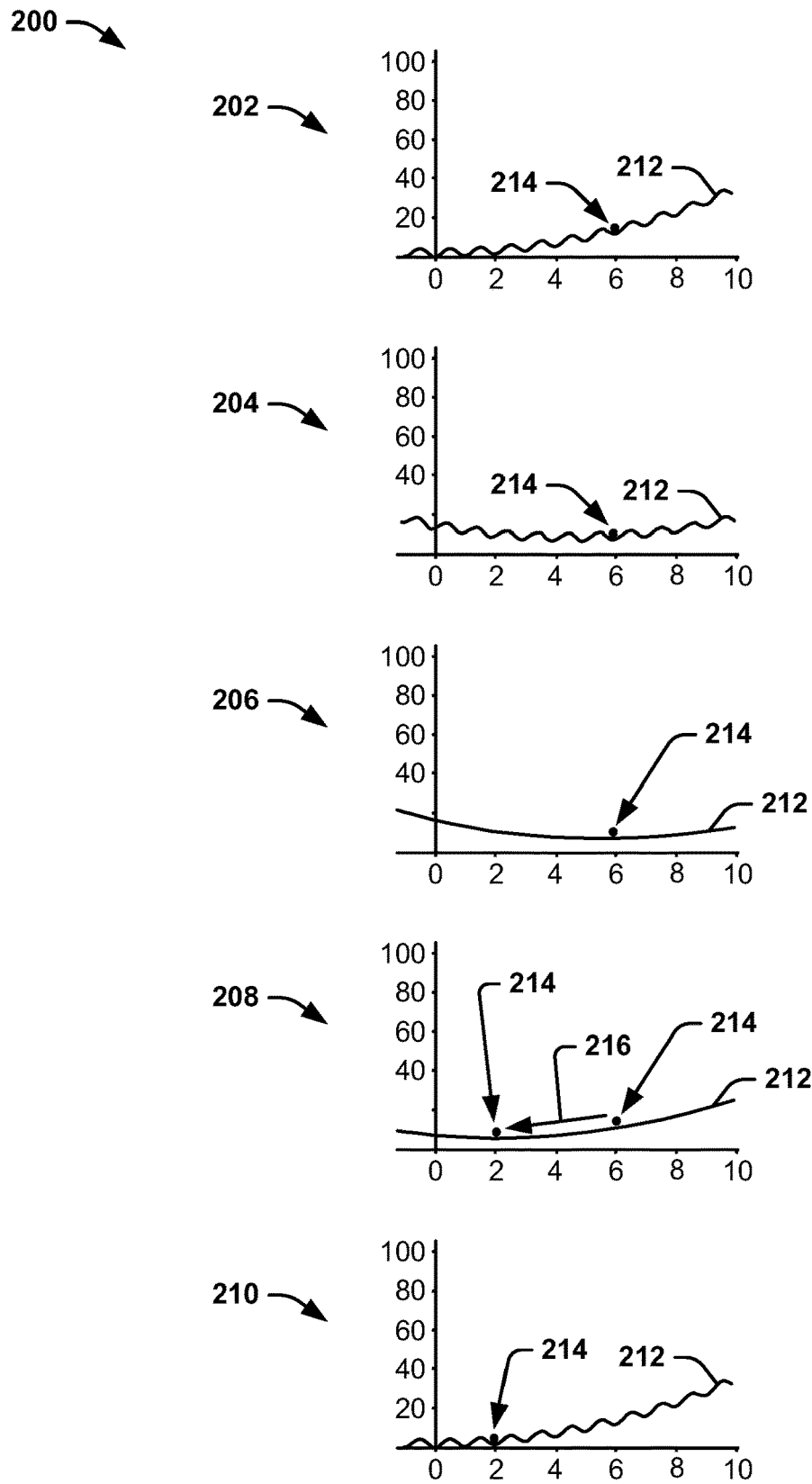
FIG. 5 illustrates yet another example diagram of setting an energy state.

FIG. 5 illustrates an example diagram 200 of setting an energy state. The diagram 200 includes a set of five graphs, demonstrated as 202, 204, 206, 208, and 210, that can correspond to the sequence of changes of the potential energy and the energy barriers of a given tunable current element, such as the tunable current elements 14 and 50 in the respective examples of FIGS. 1 and 2. Therefore, reference is to be made to the examples of FIGS. 1-3 in the following description of the examples of FIG. 5.

The first graph 202 demonstrates a default condition of the potential energy 212, and thus the default potential energy condition. The first graph 202 thus demonstrates that the discrete energy states, demonstrated as discrete energy state indices numbering from "0" through "10", have ascending energy amplitudes and are separated by the energy barriers to provide stability between each of the discrete energy states. In the first graph 202, the energy state of the tunable current element 50, demonstrated at 214, is demonstrated at index "6" initially. Therefore, the tunable current element 50 is initially hysteretically providing a magnetic flux 1 having an amplitude that corresponds to the index "6" discrete energy state.

The second graph 204 demonstrates a change in the potential energy 212 of the tunable current element 50 in response to application of the control flux $\Phi_Z$. As an example, the second control current $CTRL_Z$ can induce the control flux $\Phi_Z$ in the series loop via the inductor $L_1$, which can thus "tilt" the potential energy 212 to change the relative energy amplitudes of the discrete energy states. In the example of FIG. 5, the potential energy 212 of the tunable current element 50 is demonstrated as changing from the default potential energy condition to a different potential energy state in which the index "6" discrete energy state is set to the minimum potential energy relative to the remaining discrete energy states based on a first amplitude of the applied second control current $CTRL_Z$, and thus a first amplitude of the control flux $\Phi_Z$.

The third graph 206 demonstrates a reduction of the energy barriers in response to application of the bias flux $\Phi_X$. As described previously, the first control current $CTRL_X$ can induce the bias flux $\Phi_X$ in the SQUID 52, which can thus decrease the energy barriers between the discrete energy states of the SQUID 52. However, because the potential energy 212 was changed to set the index "6" discrete energy state as the minimum, and because the energy state 214 of the tunable current element 50 was set to the index "6" discrete energy state, the energy state 214 of the tunable current element 50 remains at the index "6" discrete energy state, even after the energy barriers between the discrete energy states is decreased.

The fourth graph 208 demonstrates another change in the potential energy 212 of the tunable current element 50 in response to application of the control flux $\Phi_Z$. As an example, the second control current $CTRL_Z$ can change from the first amplitude to a second amplitude to further "tilt" the potential energy 212 to change the relative energy amplitudes of the discrete energy states. In the example of FIG. 5, the potential energy 212 of the tunable current element 50 is demonstrated as changing from the index "6" discrete energy state being at the minimum potential energy relative to the other discrete energy states to the index "2" discrete energy state being at the minimum potential energy relative to the other discrete energy states. However, because the energy barriers are decreased via application of the first control current $CTRL_X$, and thus the bias flux $\Phi_X$, the energy state 214 of the tunable current element 50 is demonstrated as moving from the index "6" discrete energy state to approximately the index "2" discrete energy state, as demonstrated by the arrow 216.

The fifth graph 210 corresponds to a combination of the fourth and fifth graphs of the example of FIG. 3 for brevity. For example, the fifth graph 210 demonstrates an increase of the energy barriers between the discrete energy states in response to deactivation of the bias flux $\Phi_X$. As an example, while the control flux $\Phi_Z$ is maintained at the specific amplitude to maintain the index "2" energy state at the minimum relative potential energy, the first control current $CTRL_X$ can be deactivated (e.g., ceased to flow on the first control line 54), thus deactivating the bias flux $\Phi_X$ in the SQUID 52. As a result, the energy barriers return between the discrete energy states of the SQUID 52 to resume the stability between the discrete energy states. The fifth graph 210 also demonstrates another change in the potential energy 212 of the tunable current element 50 in response to deactivation of the control flux $\Phi_Z$. As an example, the second control current $CTRL_Z$ can be deactivated to deactivate the control flux $\Phi_Z$ in the series loop via the inductor $L_1$. As a result, the potential energy 212 returns to the default potential energy condition in which the indices of the discrete energy states increase in energy in ascending order. Because of the energy barriers between the discrete energy states, the energy state 214 of the tunable current element 50 can be maintained at the index "2" discrete energy state.

Accordingly, the tunable current element 50 can hysteretically provide a magnetic flux 1 having an amplitude that corresponds to the index "2" discrete energy state. As a result, a target device 12 can be inductively coupled to the respective tunable current element 50 to receive a flux bias having an amplitude corresponding to the amplitude of the magnetic flux 1, and thus the index "2" discrete energy state The example diagram 200 of the example of FIG. 5 thus demonstrates an example of adiabatically changing the energy state 214 of the tunable current element 50. In the example of FIG. 5, the energy state 214 only changes by a difference of four indices, from index "6" to index "2", instead of resetting the tunable current element 50 by changing the energy state 214 from index "6" to index "0", and then from index "0" to index "2". As a result, during the adiabatic setting of the energy state 214 from the index "6" discrete energy state to the index "2" discrete energy state, the energy released by the tunable current element 50 can be substantially mitigated relative to setting the energy state 214 via a reset of the tunable current element 50, such as similar to as demonstrated in the example of FIG. 3. As an example, associated control circuitry configured to generate the first and second control currents $CTRL_X$ and $CTRL_Z$ can implement the first and second control currents $CTRL_X$ and $CTRL_Z$ in either a reset manner or an adiabatic manner based on the difference between the initial energy state and the state to be written, such as based on an index threshold.

Figure 6:
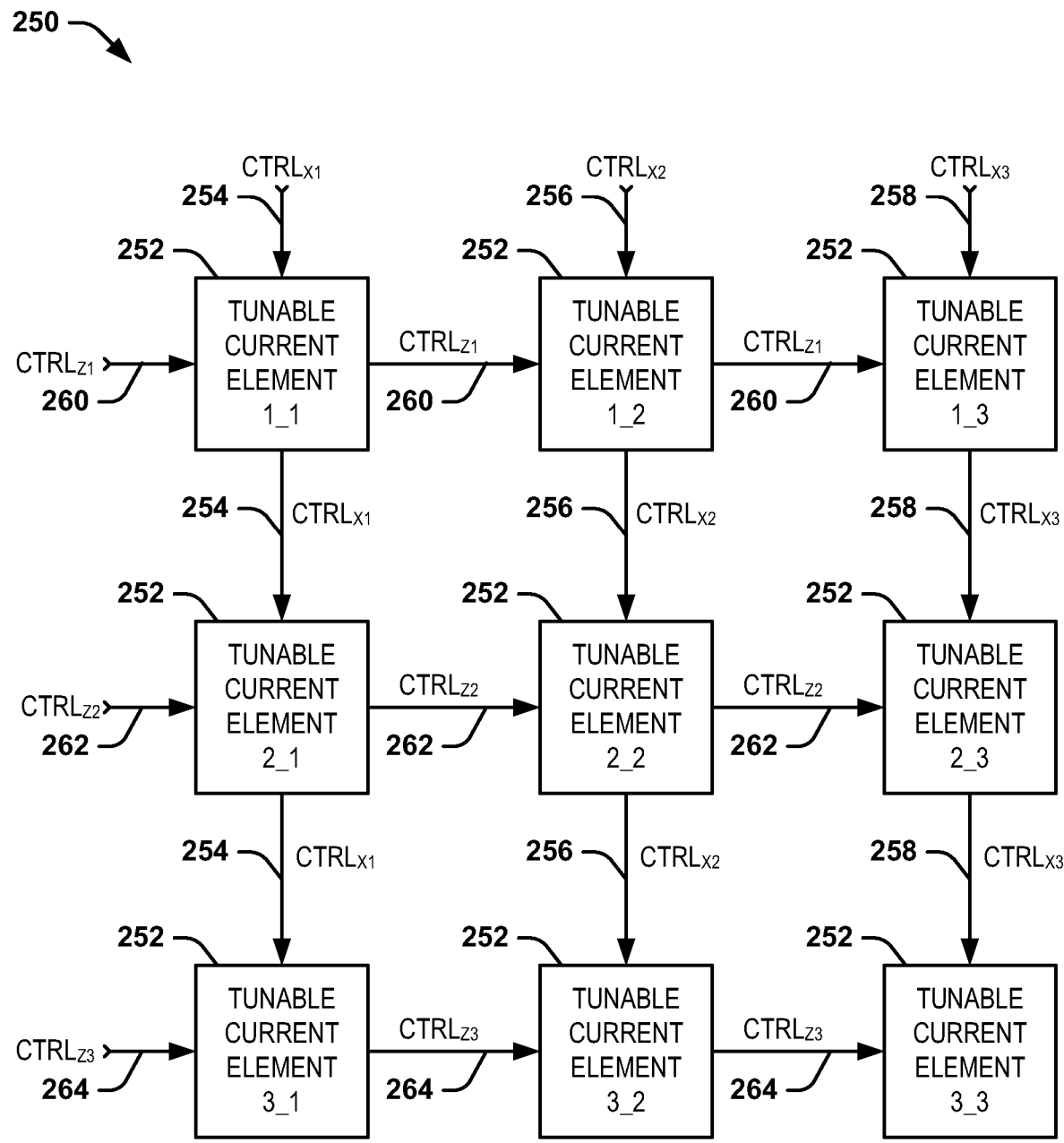
FIG. 6 illustrates another example of a magnetic flux source system.

FIG. 6 illustrates another example of a magnetic flux source system 250. The magnetic flux source system 250 can be implemented to generate a plurality of flux biases. In the example of FIG. 6, the magnetic flux source system 250 includes a plurality of tunable current elements 252 arranged in an array of rows and columns. The tunable current elements 252 are labeled as "Z_X" corresponding to the row and column, respectively, as described in greater detail herein. As an example, each of the tunable current elements 252 can be arranged substantially similarly to the tunable current element 50 in the example of FIG. 2. Therefore, each of the tunable current elements 252 can include a SQUID in a series loop with an inductor. The tunable current elements 252 can thus be accessed in a manner similar to a memory system, as described in greater detail herein.

In the example of FIG. 6, the first column of tunable current elements 252 is provided a control current $CTRL_{X1}$ via a first control line 254, the second column of tunable current elements 252 is provided a control current $CTRL_{X2}$ via a second control line 256, and the third column of tunable current elements 252 is provided a control current $CTRL_{X3}$ via a third control line 258. As an example, the control currents $CTRL_{X1}$, $CTRL_{X2}$, and $CTRL_{X3}$ can each correspond to the "first control current $CTRL_X$" with respect to the tunable current elements 252 in the respective columns. Therefore, the control current $CTRL_{X1}$ can generate a bias flux $\Phi_X$ through a SQUID associated with each of the tunable current elements 252 in the first column concurrently, the control current $CTRL_{X2}$ can generate a bias flux $\Phi_X$ through a SQUID associated with each of the tunable current elements 252 in the second column concurrently, and the control current $CTRL_{X3}$ can generate a bias flux $\Phi_X$ through a SQUID associated with each of the tunable current elements 252 in the third column concurrently.

In the example of FIG. 6, the first row of tunable current elements 252 is provided a control current $CTRL_{Z1}$ via a first control line 260, the second row of tunable current elements 252 is provided a control current $CTRL_{Z2}$ via a second control line 262, and the third row of tunable current elements 252 is provided a control current $CTRL_{Z3}$ via a third control line 264. As an example, the control currents $CTRL_{Z1}$, $CTRL_{Z2}$, and $CTRL_{Z3}$ can each correspond to the "second control current $CTRL_Z$" with respect to the tunable current elements 252 in the respective rows. Therefore, the control current $CTRL_{Z1}$ can generate a control flux $\Phi_Z$ through a series loop associated with each of the tunable current elements 252 in the first row concurrently, the control current $CTRL_{Z2}$ can generate a control flux $\Phi_Z$ through a series loop associated with each of the tunable current elements 252 in the second row concurrently, and the control current $CTRL_{Z3}$ can generate a control flux $\Phi_Z$ through a series loop associated with each of the tunable current elements 252 in the third row concurrently.

As an example, each of the tunable current elements 252 in a given column can be set to a given energy state in a sequence, such as based on being addressed by a first control current $CTRL_X$ and a second control current $CTRL_Z$. For example, the first control current $CTRL_{X1}$ can be activated to provide the bias flux $\Phi_X$ through the SQUID associated with each of the tunable current elements 252 in the first column. As a result, each of the tunable current elements 252 in the column is thus reset to the zero energy state, such as demonstrated in the example of FIG. 4. Alternatively, each of the tunable current elements 252 can first be provided the respective one of the second control currents $CTRL_Z$ at amplitudes corresponding to the initial energy states prior to the application of the first control current $CTRL_{X1}$ to adiabatically set the energy states of the tunable current elements 252 in the respective column, such as demonstrated in the example of FIG. 5.

In either example, after application of the first control current $CTRL_{X1}$, the second control currents $CTRL_Z$ can be applied to each of the respective tunable current elements 252 in the column to set the energy states, similar to as described herein. Because the first control currents $CTRL_{X2}$ and $CTRL_{X3}$ are deactivated, and thus not providing bias flux $\Phi_X$ to the SQUIDs of the tunable current elements 252 in the second and third columns, the tunable current elements 252 in the second and third columns maintain energy state stability based on the energy barriers between the discrete energy states. Accordingly, the tunable current elements 252 in the second and third columns can maintain the respective energy states and hysteretically maintain the respective magnetic fluxes 1, despite the change in potential energy resulting from application of the second control currents $CTRL_Z$.

As described previously, in the absence of adiabatically setting the energy states of the tunable current elements 252 in the example of FIG. 6, all of the tunable current elements 252 in a given column are reset in response to application of the first control current $CTRL_X$. As a result, each of the tunable current elements 252 in the respective column is subsequently provided the second control current $CTRL_Z$ to set the respective energy state, even if the new energy state is the same as the old energy state, such as if magnetic flux 1 provided by the tunable current element 252 is desired to be maintained at the same amplitude.

Figure 7:
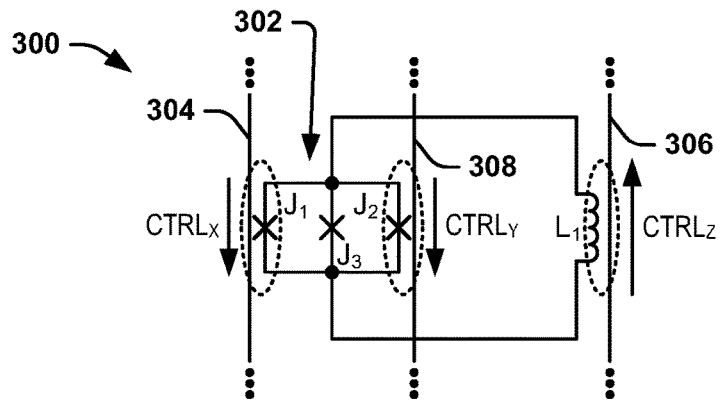
FIG. 7 illustrates another example of a tunable current element.

FIG. 7 illustrates another example of a tunable current element 300. The tunable current element 300 can correspond to one of the tunable current elements 14 in the example of FIG. 1. Therefore, reference is to be made to the example of FIG. 1 in the following description of the example of FIG. 7.

The tunable current element 300 includes a first Josephson junction $J_1$, a second Josephson junction $J_2$, and a third Josephson junction $J_3$ that are arranged in parallel, and thus correspond to a SQUID 302. The SQUID 302 is demonstrated as being arranged in a series loop with an inductor $L_1$. In the example of FIG. 7, a first control line 304 is demonstrated as being inductively coupled to the SQUID 302, and particularly coupled to the Josephson junction $J_1$. The first control line 304 is demonstrated as conducting a first control current $CTRL_X$. As an example, X can correspond to a given one of a plurality of columns (or rows) associated with an array of tunable current elements 300. Similarly, a second control line 306 is demonstrated as being inductively coupled to the inductor $L_1$. The second control line 306 is demonstrated as conducting a second control current $CTRL_Z$. As an example, Z can correspond to a given one of a plurality of rows (or columns) associated with the array of tunable current elements 300. In addition, a third control line 308 is demonstrated as being inductively coupled to the SQUID 302, and particularly coupled to the Josephson junction $J_3$. The third control line 308 is demonstrated as conducting a third control current $CTRL_Y$. As an example, Y can correspond to a given one of a grouping of both columns and rows associated with an array of tunable current elements 300.

Therefore, the first, second, and third control currents $CTRL_X$, $CTRL_Z$, and $CTRL_Y$, respectively, can set an energy state of the tunable current element 300, such as in an addressable manner similar to a memory array. For example, the first control current $CTRL_X$ and the third control current $CTRL_Y$ can be provided concurrently to induce a bias flux in the SQUID 302 to reduce the energy barriers between the discrete energy states of the tunable current element 300. Therefore, the energy barriers can be reduced enough to provide instability in response to application of both the first control current $CTRL_X$ and the third control current $CTRL_Y$, as opposed to only one of the first control current $CTRL_X$ and the third control current $CTRL_Y$, to provide greater flexibility of addressing the tunable current element 300. As another example, the second control current $CTRL_Z$ can induce a control flux in the series loop of the tunable current element 300 to change the potential energy of the tunable current element 300, similar to as described previously. As an example, the tunable current element 300 can be expressed as follows when properly biased:

$$\beta e^{-i\gamma} = \left(\frac{2\pi}{\Phi_0}\right) L(Ic_1 e^{-i2\pi\Phi_X/\Phi_0} + Ic_2 + Ic_3 e^{i2\pi\Phi_Y/\Phi_0}) \quad \text{Equation 51}$$

Figure 8:
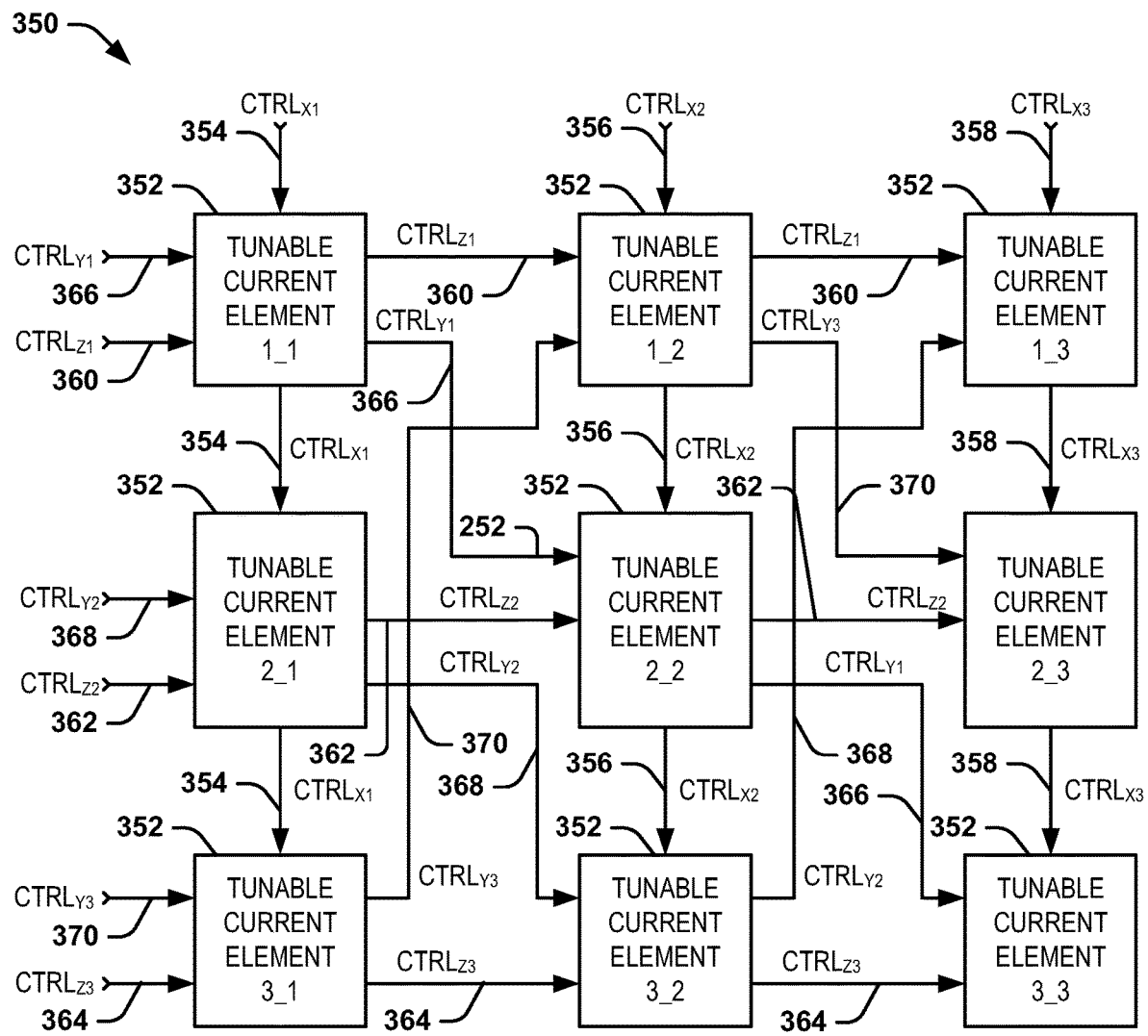
FIG. 8 illustrates another example of a magnetic flux source system.

FIG. 8 illustrates another example of a magnetic flux source system 350. The magnetic flux source system 350 can be implemented to generate a plurality of flux biases. In the example of FIG. 8, the magnetic flux source system 350 includes a plurality of tunable current elements 352 arranged in an array of rows and columns. The tunable current elements 352 are labeled as "Z_X" corresponding to the row and column, respectively, as described in greater detail herein. As an example, each of the tunable current elements 352 can be arranged substantially similarly to the tunable current element 300 in the example of FIG. 7. Therefore, each of the tunable current elements 352 can include a three Josephson junction SQUID in a series loop with an inductor. The tunable current elements 352 can thus be accessed in a manner similar to a memory system, as described in greater detail herein.

In the example of FIG. 8, the first column of tunable current elements 352 is provided a control current $CTRL_{X1}$ via a first control line 354, the second column of tunable current elements 352 is provided a control current $CTRL_{X2}$ via a second control line 356, and the third column of tunable current elements 352 is provided a control current $CTRL_{X3}$ via a third control line 358. As an example, the control currents $CTRL_{X1}$, $CTRL_{X2}$, and $CTRL_{X3}$ can each correspond to the "first control current $CTRL_X$" with respect to the tunable current elements 352 in the respective columns. Therefore, the control current $CTRL_{X1}$ can generate a first bias flux $\Phi_X$ through a SQUID (e.g., through the first Josephson junction $J_1$) associated with each of the tunable current elements 352 in the first column concurrently, the control current $CTRL_{X2}$ can generate a first bias flux $\Phi_X$ through a SQUID (e.g., through the first Josephson junction $J_1$) associated with each of the tunable current elements 352 in the second column concurrently, and the control current $CTRL_{X3}$ can generate a first bias flux $\Phi_X$ through a SQUID (e.g., through the first Josephson junction $J_1$) associated with each of the tunable current elements 352 in the third column concurrently.

In the example of FIG. 8, the first row of tunable current elements 352 is provided a control current $CTRL_{Z1}$ via a first control line 360, the second row of tunable current elements 352 is provided a control current $CTRL_{Z2}$ via a second control line 362, and the third row of tunable current elements 352 is provided a control current $CTRL_{Z3}$ via a third control line 364. As an example, the control currents $CTRL_{Z1}$, $CTRL_{Z2}$, and $CTRL_{Z3}$ can each correspond to the "second control current $CTRL_Z$" with respect to the tunable current elements 352 in the respective rows. Therefore, the control current $CTRL_{Z1}$ can generate a control flux $\Phi_Z$ through a series loop associated with each of the tunable current elements 352 in the first row concurrently, the control current $CTRL_{Z2}$ can generate a control flux $\Phi_Z$ through a series loop associated with each of the tunable current elements 352 in the second row concurrently, and the control current $CTRL_{Z3}$ can generate a control flux $\Phi_Z$ through a series loop associated with each of the tunable current elements 352 in the third row concurrently.

As a further example, control currents $CTRL_{Y1}$, $CTRL_{Y2}$, and $CTRL_{Y3}$ can be provided through the tunable current elements in a row and column staggered manner. The control currents $CTRL_{Y1}$, $CTRL_{Y2}$, and $CTRL_{Y3}$ can thus correspond to the "third control current $CTRL_Y$" in the example of FIG. 7. Therefore, the control current $CTRL_{Y1}$, provided via a first control line 366, can generate a second bias flux $\Phi_Y$ through a SQUID (e.g., through the third Josephson junction $J_3$) associated with each of the tunable current elements 352 in the first column concurrently, the control current $CTRL_{Y2}$, provided via a second control line 368, can generate a second bias flux $\Phi_Y$ through a SQUID (e.g., through the third Josephson junction $J_3$) associated with each of the tunable current elements 352 in the second column concurrently, and the control current $CTRL_{Y3}$, provided via a third control line 370, can generate a second bias flux $\Phi_Y$ through a SQUID (e.g., through the third Josephson junction $J_3$) associated with each of the tunable current elements 352 in the third column concurrently.

In the example of FIG. 8, a control current $CTRL_{Y1}$ is provided through the tunable current element 352 in the first row and first column, through the tunable current element 352 in the second row and second column, and through the tunable current element 352 in the third row and third column. The control current $CTRL_{Y2}$ is provided through the tunable current element 352 in the second row and first column, through the tunable current element 352 in the third row and second column, and through the tunable current element 352 in the first row and third column. The control current $CTRL_{Y3}$ is provided through the tunable current element 352 in the third row and first column, through the tunable current element 352 in the first row and second column, and through the tunable current element 352 in the second row and third column.

The tunable current elements 352 can thus be addressed in a more individual manner relative to the tunable current elements 352 in the example of FIG. 6. As described previously, in the absence of adiabatically setting the energy states of the tunable current elements 252 in the example of FIG. 6, all of the tunable current elements 252 in a given column are reset in response to application of the first control current $CTRL_X$. However, because the tunable current elements 352 are responsive to both the first and third control currents $CTRL_X$ and $CTRL_Y$ to provide sufficient respective flux bias $\Phi_X$ and $\Phi_Y$ in combination to reduce the energy barriers, application of only the first control current $CTRL_X$ to provide a respective flux bias $\Phi_X$ is not sufficient to reset the respective other tunable current elements 352 in the respective column. Therefore, because the third control currents $CTRL_Y$ are not associated with each of the tunable current elements 352 in a given row or column, but instead span multiple rows and columns, each of the tunable current elements 352 can be individually addressed to set the respective energy state in a non-adiabatic or an adiabatic manner without resetting any of tunable current elements 352 that are not being individually addressed.

Referring back to the example of FIG. 7, as described previously, the tunable current element 300 is responsive to both the first and third control currents $CTRL_X$ and $CTRL_Y$ to provide sufficient respective flux bias $\Phi_X$ and $\Phi_Y$ in combination to reduce the energy barriers between the discrete energy states of the tunable current elements 300. However, there may exist an asymmetry to the Josephson junctions $J_1$ and $J_3$, relative to the junction $J_2$, such as to provide a mismatch between the intended flux bias $\Phi_X$ and $\Phi_Y$ that reset the energy state of the tunable current element and the actual flux bias values that reset the energy state of the tunable current element. As a result, the control scheme for simultaneously addressing of the tunable current elements 352 can be difficult to provide consistent sufficient flux bias of the respective SQUIDs to reduce the energy barriers. In addition, such a control scheme as demonstrated in the example of FIG. 8 can be overly complicated based on having a large number of control current conductors and/or pins for the addressing scheme, particularly for a magnetic flux source system that may include thousands of tunable current elements 352.

Figure 9:
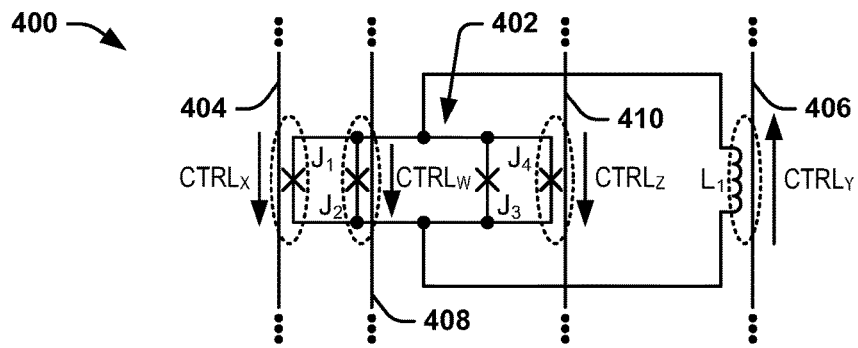
FIG. 9 illustrates another example of a tunable current element.

FIG. 9 illustrates another example of a tunable current element 400. The tunable current element 400 can correspond to one of the tunable current elements 14 in the example of FIG. 1. Therefore, reference is to be made to the example of FIG. 1 in the following description of the example of FIG. 9.

The tunable current element 400 includes a first Josephson junction $J_1$, a second Josephson junction $J_2$, a third Josephson junction $J_3$, and a fourth Josephson junction $J_4$ that are arranged in parallel, and thus correspond to a SQUID 402. The SQUID 402 is demonstrated as being arranged in a series loop with an inductor $L_1$. In the example of FIG. 9, a first control line 404 is demonstrated as being inductively coupled to the SQUID 402, and particularly coupled to the Josephson junction $J_1$. The first control line 404 is demonstrated as conducting a first control current $CTRL_X$. As an example, X can correspond to a given one of a plurality of columns (or rows) associated with an array of tunable current elements 400. Similarly, a second control line 406 is demonstrated as being inductively coupled to the inductor $L_1$. The second control line 406 is demonstrated as conducting a second control current $CTRL_Z$. As an example, Y can correspond to a given one of a plurality of rows (or columns) associated with the array of tunable current elements 400.

In addition, a third control line 408 is demonstrated as being inductively coupled to the SQUID 402, and particularly coupled to the Josephson junction $J_2$. The third control line 408 is demonstrated as conducting a third control current $CTRL_Y$. As an example, Y can correspond to a given one of a grouping of both columns and rows associated with an array of tunable current elements 400. In addition, a fourth control line 410 is demonstrated as being inductively coupled to the SQUID 402, and particularly coupled to the Josephson junction $J_4$. The third control line 408 is demonstrated as conducting a fourth control current $CTRL_W$. As an example, W can correspond to a given subset of the array of rows and columns, such as including both columns and rows associated with an array of tunable current elements 400.

Therefore, the first, second, third, and fourth control currents $CTRL_X$, $CTRL_Z$, $CTRL_Y$, and $CTRL_W$ respectively, can set an energy state of the tunable current element 400, such as in an addressable manner similar to a memory array. For example, the first control current $CTRL_X$, the third control current $CTRL_Y$, and the fourth control current $CTRL_W$ can be provided concurrently to induce a bias flux in the SQUID 402 to reduce the energy barriers between the discrete energy states of the tunable current element 400. Therefore, the energy barriers can be reduced enough to provide instability in response to application of the combination of the first, third, and fourth control currents $CTRL_X$, $CTRL_Y$, and $CTRL_W$, respectively, as opposed to only one or two of the first, third, and fourth control currents $CTRL_X$, $CTRL_Y$, and $CTRL_W$, to provide greater flexibility of addressing the tunable current element 400. As another example, the second control current $CTRL_Z$ can induce a control flux in the series loop of the tunable current element 400 to change the potential energy of the tunable current element 400, similar to as described previously.

The SQUID 402 of the tunable current element 400 thus includes three separate loops in which bias flux is provided. The control scheme of implementing three control currents $CTRL_X$, $CTRL_Z$, $CTRL_Y$, and $CTRL_W$ to provide respective bias fluxes $\Phi_X$, $\Phi_Y$, and $\Phi_W$ can thus mitigate deleterious effects resulting from asymmetry in the Josephson junctions $J_1$, $J_2$, $J_3$, and $J_4$. For example, the tunable current element 400 can be expressed as follows when properly biased:

$$\beta e^{-i\gamma} = \left(\frac{2\pi}{\Phi_0}\right) L(Ic_1 e^{-i2\pi\Phi_X/\Phi_0} + Ic_2 + Ic_3 e^{i2\pi\Phi_W/\Phi_0} + Ic_4 e^{i2\pi\Phi_Y/\Phi_0})$$

Equation 5

Figure 10:
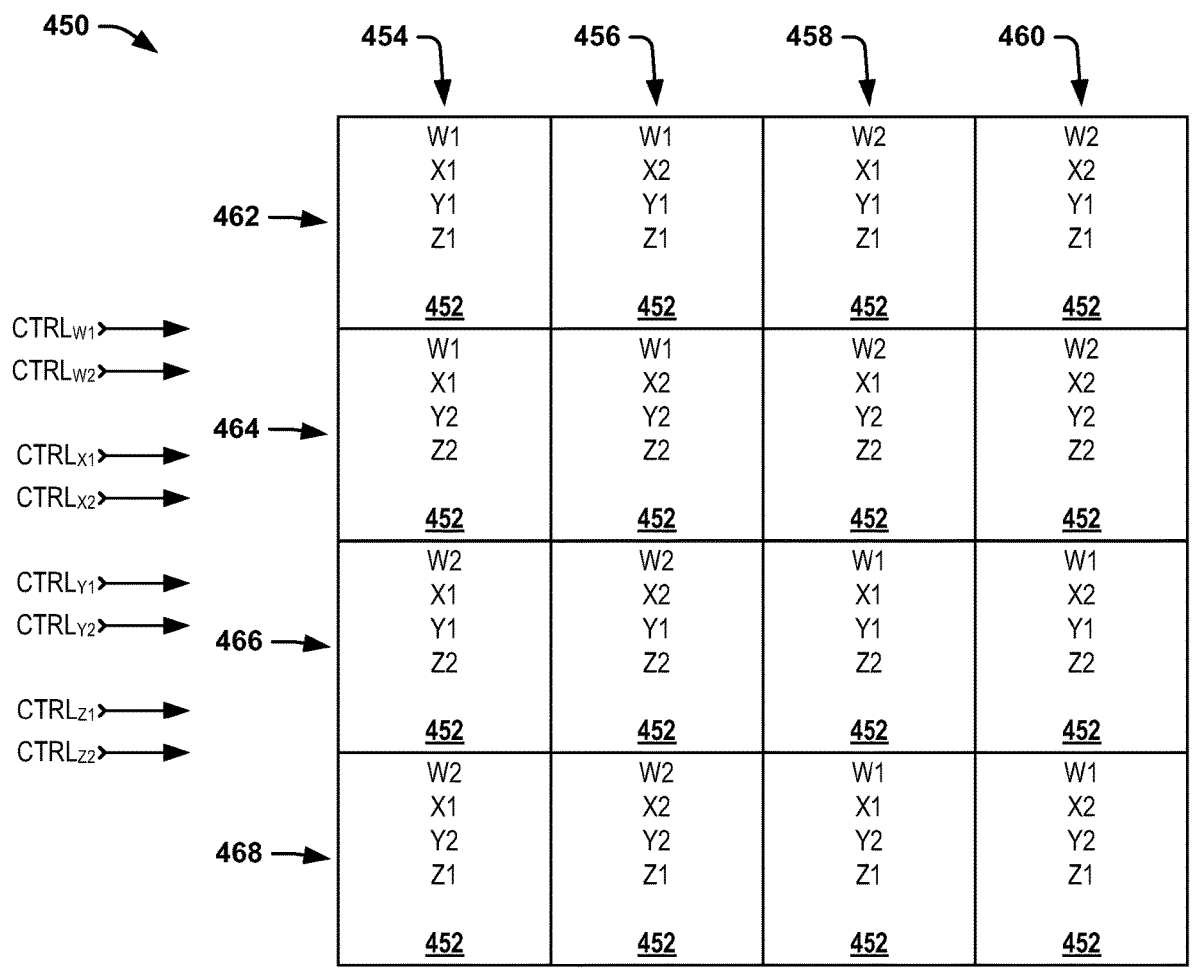
FIG. 10 illustrates another example of a magnetic flux source system.

FIG. 10 illustrates another example of a magnetic flux source system 450. The magnetic flux source system 450 can be implemented to generate a plurality of flux biases. In the example of FIG. 10, the magnetic flux source system 450 includes a plurality of tunable current elements 452 arranged in an array of four rows and four columns. The tunable current elements 452 are demonstrated as arranged in an array that includes a first column 454, a second column 456, a third column 458, and a fourth column 460, and that includes a first row 462, a second row 464, a third row 466, and a fourth row 468. As an example, each of the tunable current elements 452 can be arranged substantially similarly to the tunable current element 400 in the example of FIG. 9. Therefore, each of the tunable current elements 452 can include a four Josephson junction SQUID in a series loop with an inductor. The tunable current elements 452 can thus be accessed in a manner similar to a memory system, as described in greater detail herein.

The example of FIG. 10 demonstrates that the array of tunable current elements 452 receives four sets of two control currents, demonstrated as first control currents $CTRL_{X1}$ and $CTRL_{X2}$, second control currents $CTRL_{Z1}$ and $CTRL_{Z2}$, third control currents $CTRL_{Y1}$ and $CTRL_{Y2}$, and fourth control currents $CTRL_{W1}$ and $CTRL_{W2}$. The first control currents $CTRL_{X1}$ and $CTRL_{X2}$ thus correspond to the first control current $CTRL_X$ in the example of FIG. 9, the second control currents $CTRL_{Z1}$ and $CTRL_{Z2}$ thus correspond to the second control current $CTRL_Z$ in the example of FIG. 9, the third control currents $CTRL_{Y1}$ and $CTRL_{Y2}$ thus correspond to the third control current $CTRL_Y$ in the example of FIG. 9, and the fourth control currents $CTRL_{W1}$ and $CTRL_{W2}$ thus correspond to the fourth control current $CTRL_W$ in the example of FIG. 9.

In the example of FIG. 10, the control currents are provided to the tunable current elements 452 in a manner that allows for both specific addressability and reduction of the quantity of control currents necessary to do so. In other words, each of the tunable current elements 452 receives a unique combination (e.g., code) of the first control currents $CTRL_{X1}$ and $CTRL_{X2}$, second control currents $CTRL_{Z1}$ and $CTRL_{Z2}$, third control currents $CTRL_{Y1}$ and $CTRL_{Y2}$, and fourth control currents $CTRL_{W1}$ and $CTRL_{W2}$ to set the energy state, as described herein. The code of the control currents is demonstrated on each of the tunable current elements 452, as opposed to the example of FIG. 10 demonstrating the interconnection of the control currents between the tunable current elements 452 for the sake of brevity and ease of demonstration.

In the example of FIG. 10, the control current $CTRL_{X1}$ is demonstrated as being provided to each of the tunable current elements 452 in the first column 454 and the third column 458, and the control current $CTRL_{X2}$ is demonstrated as being provided to each of the tunable current elements 452 in the second column 456 and the third column 460. The control current $CTRL_{Z1}$ is demonstrated as being provided to each of the tunable current elements 452 in the first row 462 and the fourth row 468, and the control current $CTRL_{Z2}$ is demonstrated as being provided to each of the tunable current elements 452 in the second row 464 and the third row 466. The control current $CTRL_{Y1}$ is demonstrated as being provided to each of the tunable current elements 452 in the first row 462 and the third row 466, and the control current $CTRL_{Y2}$ is demonstrated as being provided to each of the tunable current elements 452 in the second row 464 and the fourth row 466.

The control current $CTRL_{W1}$ is demonstrated as being provided to a first "quadrant" of the array, demonstrated as the tunable current elements 452 in the first row and first column, the first row and second column, the second row and first column, and the second row and second column. The control current $CTRL_{W1}$ is demonstrated as also being provided to a second "quadrant" of the array, demonstrated as the tunable current elements 452 in the third row and third column, the third row and fourth column, the fourth row and third column, and the fourth row and fourth column. The control current $CTRL_{W2}$ is demonstrated as being provided to a third "quadrant" of the array, demonstrated as the tunable current elements 452 in the first row and third column, the first row and fourth column, the second row and third column, and the second row and fourth column. The control current $CTRL_{W2}$ is demonstrated as also being provided to a fourth "quadrant" of the array, demonstrated as the tunable current elements 452 in the third row and first column, the third row and second column, the fourth row and first column, and the fourth row and second column.

The tunable current elements 452 can thus be addressed in a more individual manner relative to the tunable current elements 452 in the example of FIG. 6 based on the unique code of control currents and based on the tunable current elements 452 being responsive to all three of the first, third, and fourth control currents $CTRL_X$, $CTRL_Y$, and $CTRL_W$ to provide sufficient respective flux biases $\Phi_X$, $\Phi_Y$, and $\Phi_W$ in combination to reduce the energy barriers. Additionally, the three flux biases $\Phi_X$, $\Phi_Y$, and $\Phi_W$ can also provide greater mitigation of deleterious effects of asymmetry with respect to the Josephson junctions of the SQUIDs of the respective tunable current elements. Furthermore, because of the encoded addressing scheme, the tunable current elements 452 can be addressed individually by a significantly reduced number of control currents, such as down to approximately a cube-root for large arrays (e.g., three dimensional arrays) of tunable current elements 452.

Figure 11:
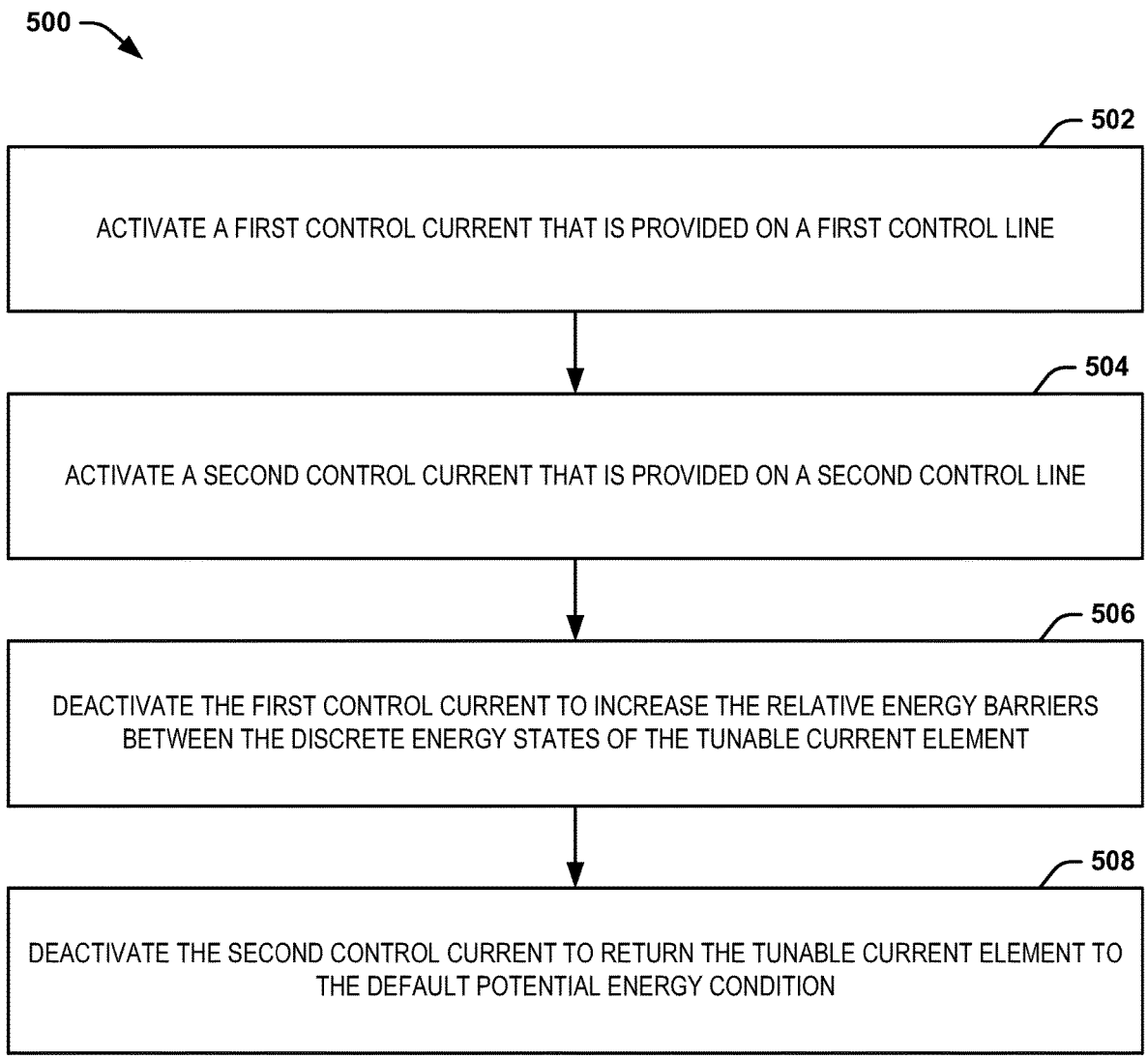
FIG. 11 illustrates an example of a method for setting a current amplitude in a magnetic flux source system.

In view of the foregoing structural and functional features described above, a methodology in accordance with various aspects of the present invention will be better appreciated with reference to FIG. 11. While, for purposes of simplicity of explanation, the methodology of FIG. 11 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 11 illustrates an example of a method 500 for generating a current (e.g., the currents $I_{FLUX}$) via a tunable current element (e.g., the tunable current elements 14). At 502, a first control current (e.g., the control current $CTRL_X$) that is provided on a first control line (e.g., the first control line 54) is activated. The first control line can be inductively coupled to a SQUID (e.g., the SQUID 52) associated with the tunable current element, such that the first control current induces a bias flux (e.g., the bias flux $\Phi_X$) in the SQUID to decrease relative energy barriers between discrete energy states of the tunable current element. At 504, a second control current (e.g., the control current $CTRL_Z$) that is provided on a second control line (e.g., the second control line 56) is activated. The second control line can be inductively coupled to an inductor (e.g., the inductor $L_1$) provided in a series loop with the SQUID associated with the tunable current element, such that the second control current induces a control flux (e.g., the control flux $\Phi_Z$) in the series loop to change a potential energy (e.g., the potential energy 112) of the discrete energy states from a default potential energy condition of the discrete energy states of the tunable current element to set an energy state of the tunable current element to a respective one of the discrete energy states. At 506, the first control current is deactivated to increase the relative energy barriers between the discrete energy states of the tunable current element. At 508, the second control current is deactivated to return the tunable current element to the default potential energy condition, such that the energy state of the tunable current element is maintained at the respective one of the discrete energy states based on the relative energy barriers between the discrete energy states.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A magnetic flux source system comprising at least one tunable current element, each of the at least one tunable current element comprising:
    a superconducting quantum interference device (SQUID) that is inductively coupled to a first control line configured to conduct a first control current, such that the first control current induces a bias flux in the SQUID to decrease relative energy barriers between discrete energy states of the respective at least one tunable current element; and
    an inductor arranged in a series loop with the SQUID and being inductively coupled to a second control line configured to conduct a second control current, such that the second control current induces a control flux in the series loop to change a potential energy of the discrete energy states of the respective at least one tunable current element to set an energy state of the at least one tunable current element to one of the discrete energy states, such that the SQUID is configured to generate a current that provides a magnetic flux at an amplitude corresponding to the energy state of the at least one tunable current element.

2. The system of claim 1, wherein the SQUID comprises a first Josephson junction, a second Josephson junction, and a third Josephson junction that are arranged in parallel with respect to each other, wherein the SQUID is controlled by the first control current that is inductively coupled to the first Josephson junction and a third control current that is inductively coupled to the third Josephson junction.

3. The system of claim 1, wherein the SQUID comprises a first Josephson junction, a second Josephson junction, a third Josephson junction, and a fourth Josephson junction that are arranged in parallel with respect to each other, wherein the SQUID is controlled by the first control current that is inductively coupled to the first Josephson junction, a third control current that is inductively coupled to the second Josephson junction, and a fourth control current that is inductively coupled to the third Josephson junction.

4. The system of claim 1, wherein the at least one tunable current element comprises a plurality of tunable current elements arranged in an array comprising at least one row and at least one column, wherein each of the plurality of tunable current elements is controlled via at least one first control current and via at least one second control current.

5. The system of claim 4, wherein each of the at least one first control current corresponds to a respective one of the at least one column, and wherein each of the at least one second control current corresponds to a respective one of the at least one row.

6. The system of claim 4, wherein the at least one first control current comprises a plurality of first control currents, wherein the at least one second control current comprises a plurality of second control currents, wherein the at least one row comprises a plurality of rows, and wherein the at least one column comprises a plurality of columns.

7. The system of claim 6, wherein the SQUID comprises a first Josephson junction, a second Josephson junction, and a third Josephson junction that are arranged in parallel with respect to each other, wherein the SQUID is controlled by one of the plurality of first control currents that is inductively coupled to the first Josephson junction and which is associated with a respective one of the plurality of columns, and one of a plurality of third control currents that is inductively coupled to the third Josephson junction, wherein each of the plurality of third control currents is associated with each of the plurality of rows alternately across the plurality of columns.

8. The system of claim 6, wherein each of the plurality of first control currents is associated with at least two of the plurality of rows or columns, wherein each of the plurality of second control currents is associated with at least two of the other of the plurality of rows or columns.

9. The system of claim 8, wherein the SQUID comprises a first Josephson junction, a second Josephson junction, a third Josephson junction, and a fourth Josephson junction that are arranged in parallel with respect to each other, wherein the SQUID is controlled by one of the plurality of first control currents that is inductively coupled to the first Josephson junction and which is associated with at least two of the plurality of columns, by one of a plurality of third control currents that is inductively coupled to the second Josephson junction and which is associated with at least two of the plurality of rows, and a fourth control current that is inductively coupled to the third Josephson junction and which is associated with a proper subset of the plurality of rows and a proper subset of the plurality of columns.

10. A circuit system comprising the magnetic flux source system of claim 4, the circuit system further comprising at least one circuit device inductively coupled to at least one of the plurality of tunable current elements, such that the at least one of the plurality of tunable current elements is configured to inductively receive the magnetic flux from each of the at least one tunable current element.

11. A method for generating a magnetic flux via a tunable current element, the method comprising:
activating a first control current that is provided on a first control line, the first control line being inductively coupled to a superconducting quantum interference device (SQUID) associated with the tunable current element, such that the first control current induces a bias flux in the SQUID to decrease relative energy barriers between discrete energy states of the tunable current element;
activating a second control current that is provided on a second control line, the second control line being inductively coupled to an inductor provided in a series loop with the SQUID associated with the tunable current element, such that the second control current induces a control flux in the series loop to change a potential energy of the discrete energy states from a default potential energy condition of the discrete energy states of the tunable current element to set an energy state of the tunable current element to a respective one of the discrete energy states;
deactivating the first control current to increase the relative energy barriers between the discrete energy states of the tunable current element; and
deactivating the second control current to return the tunable current element to the default potential energy condition, such that the energy state of the tunable current element is maintained at the respective one of the discrete energy states based on the relative energy barriers between the discrete energy states.

12. The method of claim 11, wherein the energy state of the tunable current element is initially set to a first energy state corresponding to a first one of the discrete energy states, wherein activating the first control current comprises activating the first control current to induce the bias flux in the SQUID to decrease the relative energy barriers between the discrete energy states of the tunable current element, such that the energy state of the tunable current element decreases from the first energy state to a zero energy state at the default potential energy condition of the discrete energy states.

13. The method of claim 11, wherein the energy state of the tunable current element is initially set to a first energy state corresponding to a first one of the discrete energy states, the method further comprising initially activating the second control current at a first amplitude to change the potential energy of the discrete energy states to set the first energy state to a minimum energy relative to a remaining plurality of the discrete energy states before activating the first control current, wherein activating the second control current comprises changing the second control current from the first amplitude to a second amplitude to set a second energy state at the minimum energy relative to the remaining plurality of the discrete energy states before deactivating the first control current.

14. The method of claim 11, wherein the SQUID comprises a first Josephson junction, a second Josephson junction, and a third Josephson junction that are arranged in parallel with respect to each other, the method further comprising activating a third control current that is provided on a third control line, the first and third control lines each being inductively coupled to the first and second Josephson junctions, respectively, such that the first and third control currents induces the bias flux in the SQUID to decrease the relative energy barriers between the discrete energy states of the tunable current element.

15. The method of claim 11, wherein the SQUID comprises a first Josephson junction, a second Josephson junction, a third Josephson junction, and a fourth Josephson junction that are arranged in parallel with respect to each other, the method further comprising:
activating a third control current that is provided on a third control line; and
activating a fourth control current that is provided on a fourth control line, the first, third, and fourth control lines each being inductively coupled to the first, second, and third Josephson junctions, respectively, such that the first, third, and fourth control lines induces the bias flux in the SQUID to decrease the relative energy barriers between the discrete energy states of the tunable current element.

16. The method of claim 11, wherein the magnetic flux is a first magnetic flux, and wherein the tunable current element is a first tunable current element of a plurality of tunable current elements arranged in an array comprising at least one row and at least one column, wherein activating the first control current comprises activating one of a plurality of first control currents that is provided on one of a plurality of first control lines corresponding to a respective first column of the array, and wherein activating the second control current comprises activating one of a plurality of second control currents that is provided on one of a plurality of second control lines corresponding to the other of a respective first row of the array.

17. A magnetic flux source system comprising a plurality of tunable current elements arranged in an array comprising at least one row and at least one column, each of the plurality of tunable current elements comprising:

a superconducting quantum interference device (SQUID) that is inductively coupled to a respective one of at least one first control line associated with the respective at least one column and configured to conduct a first control current, such that the respective one of the at least one first control current induces a bias flux in the SQUID to decrease relative energy barriers between discrete energy states of the respective at least one tunable current element; and an inductor arranged in a series loop with the SQUID and being inductively coupled to one of at least one second control line configured to conduct a respective one of at least one second control current associated with the respective at least one row, such that the respective one of the at least one second control current induces a control flux in the series loop to change a potential energy of the discrete energy states of the respective at least one tunable current element to set an energy state of the at least one tunable current element to one of the discrete energy states, such that the SQUID is configured to generate a current that provides a t magnetic flux at an amplitude corresponding to the energy state of the at least one tunable current element.

18. The system of claim 17, wherein the SQUID comprises a first Josephson junction, a second Josephson junction, and a third Josephson junction that are arranged in parallel with respect to each other, wherein the SQUID is controlled by the one of the at least one first control current that is inductively coupled to the first Josephson junction, and one of at least one third control current that is inductively coupled to the second Josephson junction, wherein each of the at least one third control current is associated with each of the at least one row alternately across the at least one column.

19. The system of claim 17, wherein each of the at least one first control current is associated with at least two of a plurality of columns, wherein each of the at least one second control current is associated with at least two of a plurality of rows.

20. The system of claim 19, wherein the SQUID comprises a first Josephson junction, a second Josephson junction, a third Josephson junction, and a fourth Josephson junction that are arranged in parallel with respect to each other, wherein the SQUID is controlled by one of the at least one first control current that is inductively coupled to the first Josephson junction, by one of at least one third control current that is inductively coupled to the second Josephson junction and which is associated with at least two of the plurality of rows, and a fourth control current that is inductively coupled to the third Josephson junction and which is associated with a proper subset of the plurality of rows and a proper subset of the plurality of columns.

* * * * *